United States Patent [19]

Butler

[11] Patent Number: 5,343,159

[45] Date of Patent: Aug. 30, 1994

[54] DIRECT BOX EMPLOYING HYBRID VACUUM TUBE AND SOLID STATE CIRCUITRY

[76] Inventor: Brent K. Butler, 6806 S. Norfolk St., Aurora, Colo. 80016

[21] Appl. No.: 17,764

[22] Filed: Feb. 16, 1993

[51] Int. Cl.⁵ .............................................. H03F 5/00
[52] U.S. Cl. ........................................ 330/3; 330/85; 381/120; 381/121
[58] Field of Search ................. 381/120, 121, 122, 61; 330/3, 85; 84/DIG. 10, 674, 677, 680

[56] References Cited

U.S. PATENT DOCUMENTS 3,005,164  2/1956  Newbold ............................. 330/91
5,022,305  6/1991  Butler .................................. 381/61

Primary Examiner—James B. Mullins
Assistant Examiner—Jim Dodek
Attorney, Agent, or Firm—Harness, Dickey & Pierce

[57] ABSTRACT

The direct coupled solid state-vacuum tube hybrid circuit matches a high impedance audio source to a low impedance audio destination. The resulting device supplies essentially unit gain and has both single ended and balanced outputs. The solid state operational amplifier and vacuum tube devices are DC coupled and supplied from a common low voltage DC power supply. The vacuum tube is incorporated directly in the feedback loop of the operational amplifier and a suitably chosen dampening resistor allows the circuit to provide vacuum tube characteristic warming effects without unwanted distortion or tube microphonics.

9 Claims, 1 Drawing Sheet

DIRECT BOX EMPLOYING HYBRID VACUUM TUBE AND SOLID STATE CIRCUITRY

BACKGROUND AND SUMMARY OF THE INVENTION

The present invention relates generally to audio signal processing circuitry and more particularly to a "direct box" circuit for coupling a high impedance audio source to a low impedance audio destination.

Many popular musical instruments today have a pickup or transducer by which the sound of the instrument is converted into an electrical signal which may then be electronically processed, amplified and recorded. Such instruments include electric guitars, which typically employ one or more magnetic pickups and acoustic instruments, outfitted with contact microphones and the like. In addition, musical instruments of all descriptions can be suitably played near a microphone to convert the sound into an electrical signal.

In the music and recording industries there is a wide variety of different pickups, transducers and microphones in use today. Where the instrument will be situated a long distance from the electronic processing, amplifying or recording equipment it is common to use a low impedance transmission line or cable system, often a balanced system, to minimize hum and ground loop problems. It is generally recognized that a low impedance transmission line or cable system is less susceptible to magnetically induced hum. Moreover, a balanced system, which conveys both in-phase and out-of-phase signals has the recognized advantage of eliminating common mode noise. Thus low impedance, balanced transmission lines or cables are frequently used in professional music and recording applications.

With the exception of professional low impedance, balanced microphones, most musical instrument pickups and transducers are high impedance, single ended (unbalanced) devices. For example, the classic guitar pickup may have an impedance in the range of about 50K ohms and the more modern guitar pickups with active electronic circuits may have an impedance in the range of 3K-4K ohms. When compared to a low impedance system, which is nominally 300 ohms or less, these guitar pickups are considered to be high impedance devices. Being high impedance devices, these pickups, and the transmission lines or cables connected to them tend to be quite susceptible to hum and noise.

To deal with the hum and noise problem in high impedance instruments it is common practice to use an impedance matching transformer or active electronic circuit to couple the high impedance source to a low impedance destination. Such matching transformers or circuits are sometimes referred to as "direct boxes" since they allow a high impedance device to be connected "directly" to a low impedance mixing console or other low impedance electronic device. Transformers have been employed for this purpose for many years but they are considered undesirable today, since transformers tend to degrade or color the sound by diminishing the high frequencies. Thus, today, many audio engineers prefer using active electronic circuits to match or couple the high impedance audio source to the low impedance audio destination.

To a large extent, active electronic circuits are implemented today using solid state transistor circuitry. There remains, however, a loyal group of audio engineers and musicians who favor vacuum tube circuitry because of its desirable, warm sound. Although the precise physics of this phenomenon are not fully understood, it is believed that the warm sound is attributable to the vacuum tube's tendency to produce even harmonics, which can add a subtle warming effect that is not normally found in solid state circuits. In contrast, solid state circuits may tend to produce a larger number of odd harmonics which to some sound somewhat strident or shrill.

The present invention provides a circuit for coupling a high impedance audio source to a low impedance audio destination which employs at least one solid state operational amplifier and at least one vacuum tube. The operational amplifier and vacuum tube are connected together so that the vacuum tube is in the feedback loop of the operational amplifier. The feedback loop includes a dampening impedance which permits the desirable warming characteristics of the tube to influence the output signal, but without inducing unwanted distortion or tube microphonics. The circuit is thus suitable for use in "direct box" applications particularly where the warm tube characteristic is desired.

For a more complete understanding of the invention, its objects and advantages, reference may be had to the following specification and to the accompanying drawing.

DESCRIPTION OF THE PREFERRED EMBODIMENT

Figure 1:
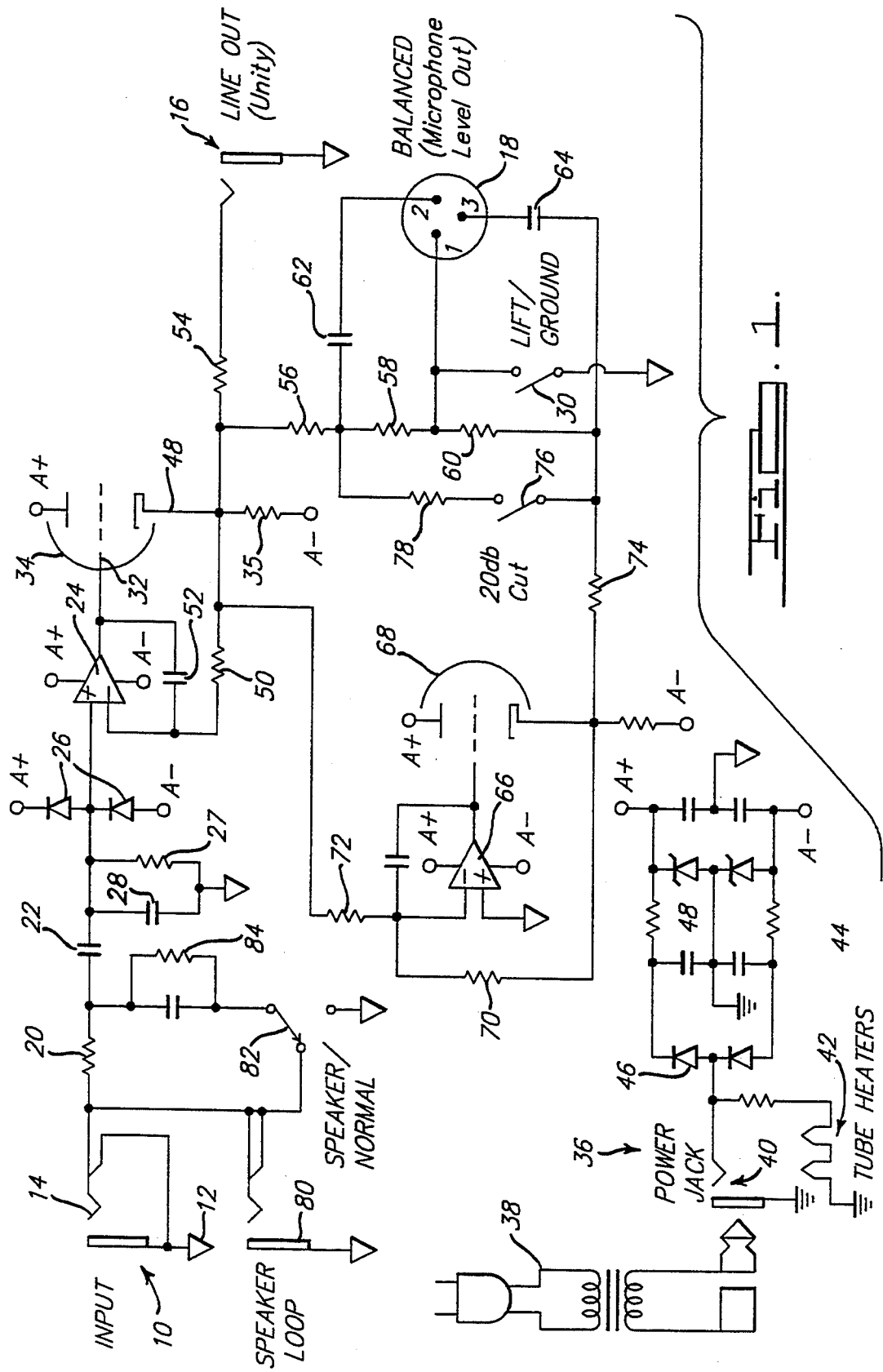
FIG. 1 is a schematic diagram illustrating the presently preferred embodiment of the circuit of the invention.

Referring to FIG. 1, the presently preferred circuit has an audio input jack or terminal 10 into which a high impedance audio source may be plugged. In the preferred embodiment input jack 10 may be a self-shorting, ¼ inch phone jack. As illustrated, the ring of jack 10 is connected to ground as at 12 and the tip is connected to the input of the circuit as at 14.

The presently preferred circuit has two output jacks, a single-ended output jack 16, which may be a nonshorting, ¼ inch phone jack, and a balanced output jack 18, which may be an XLR connector. Either of the output jacks 16 and 18 may be coupled as an output terminal to a low impedance audio destination device such as to a sound reinforcement or recording mixing console. As will be more fully explained, the circuit couples or matches the high impedance input to the low impedance output. In the preferred embodiment the circuit provides essentially unity gain.

Referring to the signal input end of the circuit, as at input jack 10, the audio signal is coupled through resistor 20 and capacitor 22 to the noninverting input (+) of operational amplifier 24. A pair of oppositely poled diodes 26 provide overload protection of the noninverting input. The diodes are respectively connected to the positive and negative power supply rails (A+ and A−). The diodes limit the audio input signal excursion voltages to the supply rail voltages and thus protect the operational amplifier from excessively large signals.

The noninverting input of operational amplifier 24 is provided with a DC reference through resistor 27 which is coupled to ground as illustrated. If desired, capacitor 28 can be provided to provide RF suppression for the noninverting input. Referring to the output jacks 16 and 18, it will be seen that the singled-ended output (jack 16) is referenced to ground. Similarly, pin 1 of the balanced output (jack 18) is also center referenced to ground, unless the normally closed ground lift switch 30 is opened.

The output of operational amplifier 24 is connected directly to the grid 32 of triode vacuum tube 34. Vacuum tube 34 may be ½ of a 12AX7 tube or the like. The anode of vacuum tube 34 is connected to the positive supply rail (A+) and the cathode is connected to the output jacks 16 and 18 as illustrated and also through resistor 35 to the negative supply rail (A−).

Notably, both the operational amplifier 24 and the vacuum tube 34 are supplied with power from the same supply rails (A+ and A−). The presently preferred power supply for developing the A+ and A− power is illustrated generally at 36. Preferably, an integrated-plug wall transformer 38 steps down the 110 volt AC line voltage to nominally 13 volt AC. A 300 milliamp wall transformer is adequate for the presently preferred circuit. The stepped down AC voltage is supplied through power supply jack 40 to the vacuum tube heaters 42 and also the DC rectifier circuit 44. The presently preferred rectifier circuit uses a half wave diode rectifier configuration 46 with oppositely poled 16 volt Zener diodes 48 and suitable resistors and filter capacitors to provide the A+ and A− DC supply rail voltages with a center reference ground. Nominally, the supply rail voltages are about ±15 volts.

By using the same low voltage DC supply rails to supply power to both the solid state and vacuum tube components, it is possible to directly couple the output of operational amplifier 24 to the grid of vacuum tube 34. This affords a number of advantages. First, the circuit does not require coupling capacitors between the output of the operational amplifier and the grid of the vacuum tube. Coupling capacitors are a source of signal degradation, since capacitors attenuate or block low frequency audio signals. Second, being supplied by the same low voltage rails, it is possible to include the cathode output of vacuum tube 34 in the feedback loop used to establish the gain of operational amplifier 24. More specifically, resistor 50 couples the cathode of vacuum tube 34 to the inverting (−) input of operational amplifier 24. If desired, a small capacitor 52 may also be included in the feedback loop to suppress RF oscillations.

Resistor 50 controls the dampening or degree to which the vacuum tube characteristics are imported into the sound. If a low resistance value or direct wire connection is chosen, the operational amplifier responds very quickly and, in effect, corrects for or eliminates any vacuum tube characteristics. On the other hand, a high resistance value allows the sound of the vacuum tube to dominate, potentially resulting in unwanted distortion and microphonics. Accordingly, the optimal selection for resistor 50 is a tradeoff between these two extremes. The presently preferred embodiment uses a resistor of 10K ohms. It has been found that this intermediate value allows a subtle warming effect of the vacuum tube to be heard without introducing unwanted distortion or microphonics.

In order to supply a balanced signal to the XLR output jack 18 the circuit includes a second operational amplifier 66 and a second triode vacuum tube 68. In practice, operational amplifiers 24 and 66 may be on the same chip and vacuum tubes 34 and 68 may be the respective halves of a dual triode device such as a 12AX7.

Operational amplifier 66 and vacuum tube 68 are direct coupled to one another and share a common feedback loop, just as operational amplifier 24 and vacuum tube 34. In that regard, resistor 70 serves as the feedback resistor which couples the output of the cathode of tube 68 with the inverting (−) terminal of operational amplifier 66. It will be seen that the inverting terminal of operational amplifier 66 receives the audio input signal, with the noninverting (+) terminal being referenced to ground. The audio signal is supplied through resistor 72 which is coupled to the cathode of tube 34. In the presently preferred embodiment resistor 72 may be on the order of 10K ohms as is resistor 70.

The operational amplifier and vacuum tube devices thus operate as a hybrid, solid state-vacuum tube circuit which effects impedance matching at substantially unity gain. Operational amplifier 24 and tube 34 form one hybrid unity gain amplifier circuit and operational amplifier 66 and tube 68 form another hybrid unity gain amplifier circuit. Because the inputs of operational amplifiers 24 and 66 are of opposite polarity, the respective hybrid circuits supply an in-phase signal and an out-of-phase signal. The outputs of these hybrid circuits are resistively coupled to the output jacks 16 and 18.

The presently preferred circuit derives the input of operational amplifier 66 from the output of the hybrid circuit comprising operational amplifier 24 and vacuum tube 34. This has been found to be a quite suitable arrangement in that the number of active electronic components is kept to a minimum. The hybrid circuit comprising operational amplifier 24 and vacuum tube 34 generates very little noise or undesirable distortion. Hence the audio signal supplied through resistor 72 to the inverting (−) input of operational amplifier 66 is quite clean. If desired, however, it is possible to use additional operational amplifiers acting as buffers in a circuit configuration which provides the audio input to the inverting (−) terminal of operational amplifier 66 without passing it first through the hybrid circuit of operational amplifier 24 and vacuum tube 34. In that way, both the in-phase and out-of-phase components would be derived directly from the input jack 10, thereby eliminating the need to cascade the two hybrid circuits together.

For the single-ended output jack 16, resistor 54 coupled to the cathode of vacuum tube 34 supplies the output signal. For the balanced (XLR) output jack 18 resistors 56, 58, 60 and 74 distribute the cathode outputs of tubes 34 and 68 to the balanced output terminals of output jack 18.

In the illustrated embodiment capacitors 62 and 64 are used to couple the balanced output terminals to the resistive network comprising resistors 56, 58, 60 and 74. Capacitors are used in the illustrated embodiment to block any DC voltage present on the balanced output terminals due to the use of phantom power. In this regard, some mixing consoles provide a 48 volt DC phantom power that is used to energize condenser microphones. Capacitors 62 and 64 will prevent any phantom power from entering the circuit via output jack 18. The use of capacitors in the output circuit may slightly degrade the low frequency response of the circuit. Thus, capacitors 62 and 64 may be optionally provided with shorting jumpers to allow the output of the circuit to be DC coupled or directly hard wired to the output jack 18 in applications where phantom power is not being used.

To maximize the circuit's usefulness, a level select switch 76 is used to switch in an additional load resistor 78 when desired. Switching the additional load resistor in the circuit cuts the output level by 20 dB. To add further versatility, the circuit includes a speaker loop jack 80 which can be optionally used as an audio input when the signal is derived from a musical amplifier speaker. More specifically, when the speaker loop jack 80 is used, the input of the present circuit is placed in series with the musical amplifier speaker lead. The speaker signal is fed through switch 82 and attenuating resistor 84 to the noninverting input of operational amplifier 24. Resistor 84 may be on the order of 1 meg ohm and should be of sufficient power rating to handle the output current of a musical instrument amplifier.

While the invention has been described in connection with the presently preferred embodiment, the principles of the invention are capable of modification and change without departing from the spirit of the invention as set forth in the following claims.

I claim:

1. A circuit for coupling a high impedance audio source to a low impedance audio destination, comprising:
   at least one operational amplifier with first and second input ports of opposite polarity and with an output port and having a feedback loop to establish the gain of said operational amplifier;
   at least one vacuum tube with cathode, plate and grid;
   the grid of said vacuum tube being coupled to the operational amplifier output port;
   an input terminal for coupling to said high impedance audio source and an output terminal for coupling to said low impedance audio destination;
   said input terminal being coupled to said first input port of said operational amplifier, and the output terminal being coupled to the cathode of said vacuum tube;
   feedback means coupled between the cathode of said vacuum tube and the second input port of said operational amplifier thereby placing said vacuum tube in the feedback loop of said operational amplifier;
   wherein said feedback means is of a preselected impedance sufficient to cause sonic effects of said vacuum tube to be imported onto sound of an audio signal transmitted through said circuit from input terminal to output terminal.

2. The circuit of claim 1 wherein said grid of said vacuum tube and said output port of said operational amplifier are direct coupled to one another.

3. A circuit for coupling a high impedance audio source to a low impedance audio destination, comprising:
   at least one operational amplifier with first and second input ports of opposite polarity and with an output port and having a feedback loop to establish the gain of said operational amplifier;
   at least one vacuum tube with cathode, plate and grid;
   the grid of said vacuum tube being coupled to the operational amplifier output port;
   an input terminal for coupling to said high impedance audio source and an output terminal for coupling to said low impedance audio destination;
   said input terminal being coupled to said first input port of said operational amplifier, and the output terminal being coupled to the cathode of said vacuum tube;
   feedback means coupled between the cathode of said vacuum tube and the second input port of said operational amplifier thereby placing said vacuum tube in the feedback loop of said operational amplifier;
   further comprising direct current power supply and wherein said vacuum tube and said operational amplifier share said direct current power supply.

4. A circuit for coupling a high impedance audio source to a low impedance audio destination, comprising:
   at least one operational amplifier with first and second input ports of opposite polarity and with an output port and having a feedback loop to establish the gain of said operational amplifier;
   at least one vacuum tube with cathode, plate and grid;
   the grid of said vacuum tube being coupled to the operational amplifier output port;
   an input terminal for coupling to said high impedance audio source and an output terminal for coupling to said low impedance audio destination;
   said input terminal being coupled to said first input port of said operational amplifier, and the output terminal being coupled to the cathode of said vacuum tube;
   feedback means coupled between the cathode of said vacuum tube and the second input port of said operational amplifier thereby placing said vacuum tube in the feedback loop of said operational amplifier;
   wherein said vacuum tube and said operational amplifier are powered by the same DC voltage rails.

5. A circuit for coupling a high impedance audio source to a balanced low impedance audio destination, comprising:
   first and second operational amplifiers each with first and second input ports of opposite polarity and each with an output port and each having a feedback loop to establish the gain of each of said operational amplifiers;
   first and second vacuum tubes each with cathode, plate and grid;
   the grid of said first vacuum tube being coupled to the first operational amplifier output port;
   the grid of said second vacuum tube being coupled to the second operational amplifier output port;
   an input terminal for coupling to said high impedance audio source and a pair of balanced output terminals of opposite polarity for coupling to said balanced low impedance audio destination;
   the input terminal having means for communicating an input signal to said first input port of said first operational amplifier and to said second input port of said second operational amplifier;
   a first one of said pair of balanced output terminals being coupled to the cathode of said first vacuum tube and a second one of said pair of balanced output terminals being coupled to said cathode of said second vacuum tube;
   first feedback means coupled between the cathode of said first vacuum tube and the second input port of said first operational amplifier thereby placing said first vacuum tube in the feedback loop of said first operational amplifier;
   second feedback means coupled between the cathode of said second vacuum tube and the second input port of said second operational amplifier thereby placing said second vacuum tube in the feedback loop of said second operational amplifier.

6. The circuit of claim 5 wherein said first and second feedback means are each of a preselected impedance sufficient to cause sonic effects of said vacuum tubes to be imported onto sound of an audio signal transmitted through said circuit from input terminal to output terminals.

7. The circuit of claim 5 wherein said grid of said first vacuum tube and said output port of said first operational amplifier are direct coupled to one another; and wherein said grid of said second vacuum tube and said output port of said second operational amplifier are direct coupled to one another.

8. The circuit of claim 5 further comprising direct current power supply and wherein said vacuum tubes and said operational amplifiers share said direct current power supply.

9. The circuit of claim 5 wherein said vacuum tubes and said operational amplifiers are powered by commonly shared DC voltage rails.

* * * * *